United States Patent
Panseri et al.

(10) Patent No.: US 11,811,446 B2
(45) Date of Patent: Nov. 7, 2023

(54) BIAS CIRCUIT FOR A LOW NOISE AMPLIFIER OF A FRONT END INTERFACE OF A RADIO FREQUENCY COMMUNICATION DEVICE THAT ENABLES FAST TRANSITIONS BETWEEN DIFFERENT OPERATING MODES

(71) Applicant: Silicon Laboratories, Inc., Austin, TX (US)

(72) Inventors: Luigi Panseri, Austin, TX (US); Yu Su, Austin, TX (US); Mustafa H. Koroglu, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 17/241,202

(22) Filed: Apr. 27, 2021

(65) Prior Publication Data

US 2022/0345170 A1    Oct. 27, 2022

(51) Int. Cl.
*H04B 1/40*    (2015.01)
*H03F 3/19*    (2006.01)

(52) U.S. Cl.
CPC ............... *H04B 1/40* (2013.01); *H03F 3/19* (2013.01); *H03F 2200/294* (2013.01); *H03F 2200/451* (2013.01)

(58) Field of Classification Search
None
See application file for complete search history.

(56) References Cited

U.S. PATENT DOCUMENTS

| | | | | |
|---|---|---|---|---|
| 5,722,063 A * | 2/1998 | Peterzell | ............ | H04B 1/70755 455/287 |
| 6,134,430 A * | 10/2000 | Younis | ................. | H04B 1/1027 455/340 |
| 6,687,491 B2 * | 2/2004 | Wieck | ..................... | H03F 1/342 455/234.1 |
| 7,109,778 B2 * | 9/2006 | Ohtani | ..................... | H04B 1/30 327/309 |
| 9,037,096 B2 * | 5/2015 | Kok | ......................... | H04B 1/44 370/329 |
| 9,166,533 B2 * | 10/2015 | Marra | ...................... | H03F 1/301 |
| 9,755,595 B1 * | 9/2017 | Lin | ....................... | H03G 1/0029 |
| 9,831,841 B2 * | 11/2017 | Wu | ........................... | H03F 1/02 |
| 10,084,415 B1 * | 9/2018 | Klaren | ...................... | H03F 3/68 |
| 10,924,063 B2 * | 2/2021 | Esmael | .................... | H03F 3/193 |

(Continued)

*Primary Examiner* — Thomas J. Hiltunen
(74) *Attorney, Agent, or Firm* — Gary Stanford; Huffman Law Group, PC

(57) ABSTRACT

A bias circuit for a low noise amplifier of a front end interface of a radio frequency communication device including a bias generator providing a bias voltage on a bias node for the low noise amplifier, a first resistive device coupled between the bias node and an input of the low noise amplifier, a first switch coupled in parallel with the first resistive device, and mode control circuitry receiving a mode signal indicative of a mode change, in which the mode control circuitry, in response to a mode change, momentarily activates the first switch to bypass the first resistive device and momentarily increases current capacity of the bias generator. The mode control circuitry may also momentarily activate a second switch to bypass a second resistive device of the bias circuit. The mode control circuitry may increase a sink current of the bias generator in response to the mode change.

19 Claims, 6 Drawing Sheets

(56) References Cited

U.S. PATENT DOCUMENTS

| | | | |
|---|---|---|---|
| 11,533,030 B2* | 12/2022 | Samata | H03F 3/195 |
| 2021/0376801 A1* | 12/2021 | Andrys | H03F 1/0222 |
| 2022/0109410 A1* | 4/2022 | Tong | H03K 5/08 |
| 2022/0345098 A1* | 10/2022 | Panseri | H03F 3/45475 |

* cited by examiner

BIAS CIRCUIT FOR A LOW NOISE AMPLIFIER OF A FRONT END INTERFACE OF A RADIO FREQUENCY COMMUNICATION DEVICE THAT ENABLES FAST TRANSITIONS BETWEEN DIFFERENT OPERATING MODES

CROSS REFERENCE TO RELATED APPLICATION(S)

This application is related to U.S. patent application Ser. No. 17/241,220, entitled "POWER LIMITING SYSTEM AND METHOD FOR A LOW NOISE AMPLIFIER OF A FRONT END INTERFACE OF A RADIO FREQUENCY COMMUNICATION DEVICE" which is filed concurrently herewith and which is hereby incorporated by reference in its entirety for all intents and purposes.

BACKGROUND OF THE INVENTION

Field of the Invention

The present invention relates in general to radio frequency (RF) communications, and more particularly to a bias circuit for a low noise amplifier of front end interface of an RF communication device that reduces transition time between different modes of operation.

Description of the Related Art

An interface may be interposed between an antenna and a communication device for optimizing performance between different modes of operation, such as between transmit and receive operating modes. The interface typically includes a low-noise amplifier (LNA) and a SAW filter. Optimal performance may be obtained by considering parameters such as noise floor (NF), linearity, stability, tuning, switching losses, isolation, and loading.

SUMMARY OF THE INVENTION

A bias circuit for a low noise amplifier of a front end interface of a radio frequency communication device according to one embodiment includes a bias generator that provides a bias voltage on a bias node for the low noise amplifier, a first resistive device coupled between the bias node and an input of the low noise amplifier, a first switch coupled in parallel with the first resistive device, and mode control circuitry receiving at least one mode signal indicative of a mode change, in which the mode control circuitry, in response to a mode change, momentarily activates the first switch to bypass the first resistive device and momentarily increases current capacity of the bias generator.

The first switch may be activated during a pulse of a mode switch signal having a duration sufficient to change from a first mode to a second mode. In one embodiment, the mode control circuitry momentarily increases current capacity of the bias generator by momentarily increasing its capacity to sink current.

The bias generator may further include a current source that provides a reference current to a first node, a reference transistor having current terminals coupled between the first node and a supply reference node and having a control terminal coupled to the bias node, a bias transistor having current terminals coupled between a source voltage node and an intermediate node and having a control terminal coupled to the first node, and a current sink coupled between the intermediate node and the supply reference node. In this case, the mode control circuitry, in response to the mode change, momentarily increases current capacity of the current sink in response to the mode change.

The bias circuit may further include a second resistive device coupled between the intermediate node and the input of the low noise amplifier and a second switch coupled in parallel with the second resistive device. In this case, the mode control circuitry, in response to the mode change, momentarily activates the second switch to bypass the second resistive device. The mode control circuitry may provide a mode switch signal to a control input of the first and second switches and to an adjust input of the current sink. The mode control circuitry may include a one-shot device or the like that asserts a pulse on the mode switch signal in response to the mode change. The mode control circuitry may assert a pulse on the mode switch signal in which the pulse has a duration sufficient for the bias circuit to adjust charge on external capacitance.

The at least one mode signal may indicate multiple operating modes including a first mode in which the low noise amplifier is placed before a filter in a receive path of a radio communication device, and a second mode in which the low noise amplifier is placed in front of the filter in the receive path. The bias circuit may further include an output resistive device coupled between the first resistive device and the input of the low noise amplifier.

A front end interface for a radio frequency communication device according to one embodiment may include multiple functional blocks, multiple switches, and a bias circuit. The functional blocks may include a low noise amplifier, a peak detector, and a saw filter. The switches may be controlled by mode control circuitry for selectively coupling selected ones of the functional blocks and multiple input/output interfaces coupled with decoupling capacitors. The bias circuit may include a bias generator that provides a bias voltage on a bias node for the low noise amplifier, a first resistive device coupled between the bias node and an input of the low noise amplifier, and a first switch coupled in parallel with the first resistive device. The mode control circuitry receives at least one mode signal indicative of a mode change and momentarily activates the first switch to bypass the first resistive device and momentarily increases current capacity of the bias generator.

A method of enabling fast transitions of a front end interface of a radio frequency communication device between multiple different operating modes according to one embodiment includes biasing an input of a low noise amplifier of the front end interface with a bias circuit, the bias circuit including a bias generator that provides a bias voltage to an input of the low noise amplifier via at least one noise reduction resistive device, receiving a mode change indication, and in response to receiving the mode change indication, momentarily shorting the at least one noise reduction resistive device and momentarily increasing a current capacity of the bias generator.

The bias circuit may include first and second noise reduction devices, and the method may include momentarily shorting the first and second noise reduction resistive devices in response to receiving the mode change indication. The bias generator may include a current sink having an input coupled to the input of the low noise amplifier, and the method may include momentarily increasing the current capacity of the current sink in response to receiving the mode change indication.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
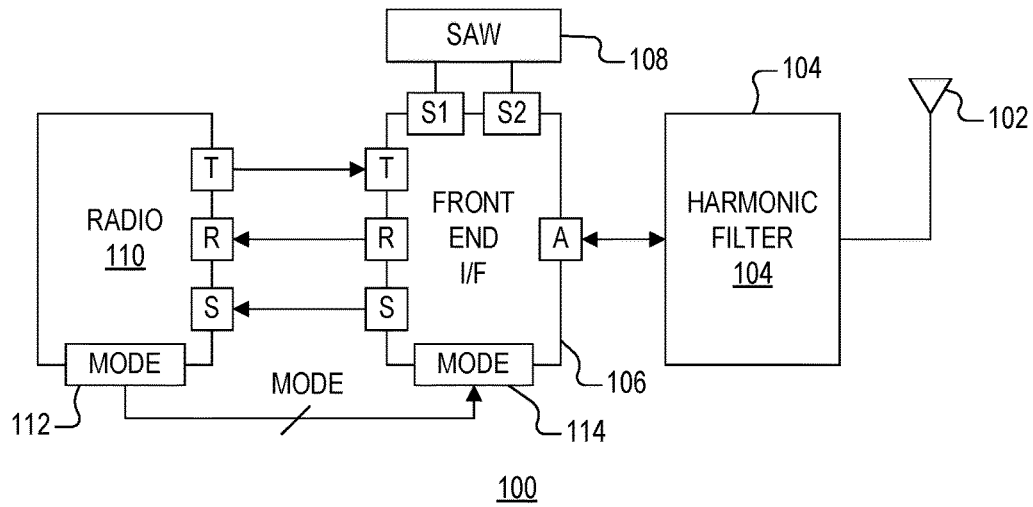
FIG. 1 is a simplified block diagram of a radio frequency (RF) communication circuit including front end interface (I/F) circuitry implemented according to one embodiment of the present disclosure.

FIG. 1 is a simplified block diagram of a radio frequency (RF) communication circuit 100 including front end interface (I/F) circuitry 106 implemented according to one embodiment of the present disclosure. The communication circuit 100 is configured as an RF transceiver, although alternative communication circuits are contemplated. The communication circuit 100 includes an antenna 102 coupled through a harmonic filter 104 to an antenna interface A of the front end I/F circuitry 106. The harmonic filter 104 generally includes a combination of inductors and capacitors for electrically matching and interfacing the antenna 102 to the front end I/F circuitry 106. The harmonic filter 104 may be any order and type implemented in any suitable manner and is not further described. The front end I/F circuitry 106 includes a pair of input/output (I/O) interfaces S1 and S2 coupled to two terminals of a surface acoustic wave (SAW) filter 108. The SAW filter 108 is only one topology of many different types of high quality (Q) factor filters or high resolution passive conversion filters that may be used for isolating frequencies of interest of a signal being transmitted or received.

The front end I/F circuitry 106 includes a transmit interface T, a receive interface R, and a sense interface S coupled to a transmit interface T, a receive interface R, and a sense interface S, respectively, of a radio 110. Each of the interfaces may be an input, an output, or a combination of both (e.g., I/O). The radio 110 includes transmit circuitry, receive circuitry, and processing circuitry for transmitting and receiving information via the antenna 102 according to any one or more wireless protocols. The communication details of the radio 110 are not further described. The front end I/F circuitry 106 also includes the S1 and S2 interfaces for coupling to the SAW filter 108. Although the SAW filter 108 is shown as a separate device in the illustrated configuration, the SAW filter 108 may be considered as part of the front end I/F circuitry 106 since used for each of the transmit and receive operations.

The radio 110 includes a MODE interface 112 coupled to a corresponding MODE interface 114 of the front end I/F circuitry 106 for selecting and controlling a mode of operation of the communication circuit 100. One or more separate MODE signals may be provided between the MODE interfaces 112 and 114 for controlling the mode of operation of the front end I/F circuitry 106. For example, at least one transmit mode may be defined in which the radio 110 controls the MODE signals to configure the front end I/F circuitry 106 into a transmit mode of operation. During the transmit mode, the radio 110 outputs a packet of information from its T output through the front end I/F circuitry 106 and to the antenna 102 via the harmonic filter 104. Multiple receive modes are defined as further described herein, in which information received by the antenna 102 and provided through the harmonic filter 104 is received at the A interface of the front end I/F circuitry 106. The received signal is filtered and/or amplified depending upon the mode and ultimately provided to the radio 110 via the R interface of the front end I/F circuitry 106. The front end I/F circuitry 106 may have at least one "off" mode when the radio 110 is not performing transmit or receive operations. It is noted that the S1, S2, T, R, S, and MODE interfaces may be configured in any suitable manner, such as conductive pins, pads, wires, traces, etc.

Figure 2:
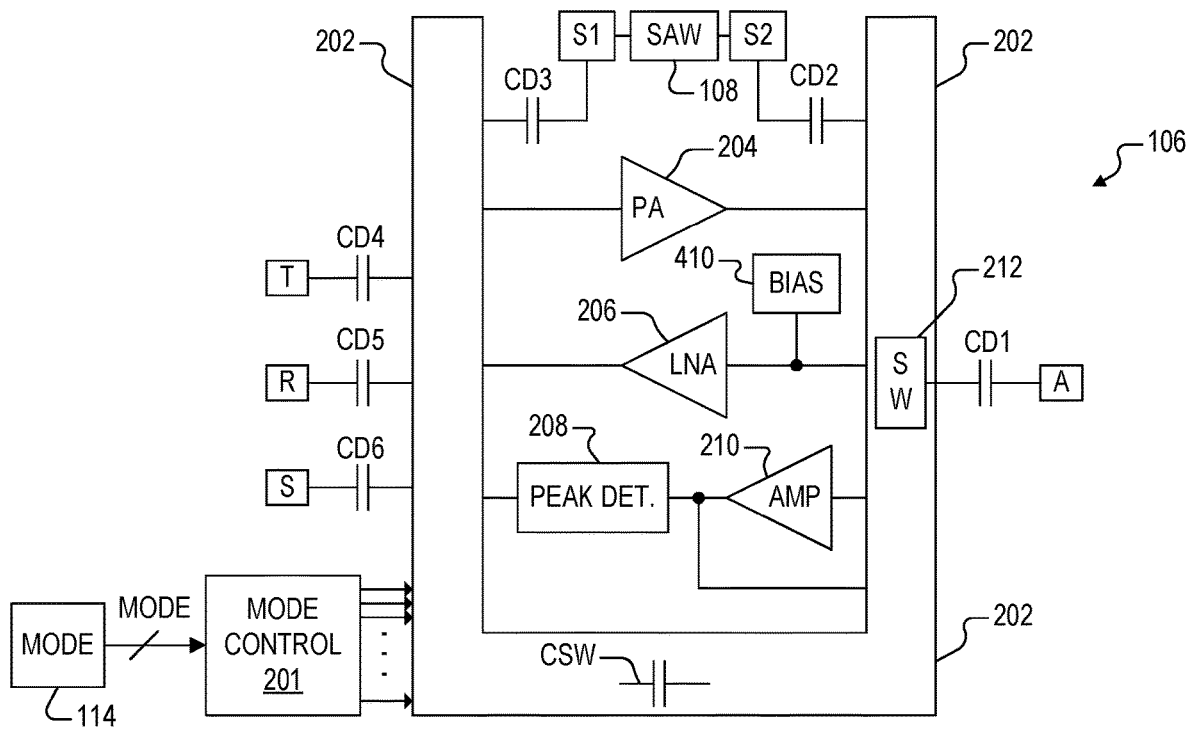
FIG. 2 is a simplified block diagram of the front end I/F circuitry of FIG. 1 implemented according to one embodiment of the present disclosure including an LNA.

FIG. 2 is a simplified block diagram of the front end I/F circuitry 106 implemented according to one embodiment of the present disclosure. The MODE interface 114 conveys the MODE signals to mode control circuitry 201, which converts or translates the MODE signals into a set of switch control signal that control the state of each of a set of switches 202. The switches 202 determine a selected connectivity of the SAW filter 108 and with other functional blocks of the front end I/F circuitry 106 to each other or to the A, T, R, S, S1, and S2 interfaces depending upon the operating mode. The other functional devices of the front end I/F circuitry 106 may include, for example, a power amplifier (PA) 204, a low noise amplifier (LNA) 206, a peak detector 208, and an amplifier 210. The PA 204 and the LNA 206 each have an input and an output coupled to respective terminals of the switches 202. The amplifier 210 has an input coupled to the switches 202 and an output coupled to the input of the peak detector 208, which has its output coupled to the switches 202. It is noted that the amplifier 210 may be a broad-band amplifier that drives the peak-to-peak level provided at its input to improve sensitivity of the peak detector 208. In addition, the input of the peak detector 208 may also be coupled to the switches 202 for selectively bypassing the amplifier 210 for some modes of operation.

The front end I/F circuitry 106 may include other devices and supporting circuitry (not shown). The PA 204 is used to amplify information to be transmitted via the antenna 102 and is not further described. The front end I/F circuitry 106 supports multiple receive operation modes in which the switches 202 are controlled to determine selection and/or connectivity of the LNA 206, the peak detector 208, and the amplifier 210 as further described herein. The particular implementation of each of the switches 202 is not further described, but are nonetheless implemented in any suitable manner such as using transistor devices or the like.

Each of a set of decoupling capacitors CD1, CD2, CD3, CD4, CD5, and CD6 is shown coupled between the switches 202 and a respective one of the interfaces A, S2, S1, T, R, and S. The decoupling capacitors CD-CD6 are used to remove direct-current (DC) voltage. In addition, a switch capacitor CSW is shown as part of the switches 202 that represents any capacitance of the individual switches along with stray capacitance or the like within the circuitry of the switches 202. For example, the front end I/F circuitry 106 includes a set of large switches 212 coupled to the A interface for both transmit and receive operating modes. The PA 204 generates a large transmit signal at its output with significant power and voltage levels. The switches 212 are therefore implemented with either large switching transistor devices or a significant number of transistor devices or a combination of both for handling transmit energy. These same large switches 212 are used during the receive operating mode and are present during transitions between different receive operating modes. The switch capacitor CSW includes the capacitance associated with the large switches 212. The overall capacitance of the front end I/F circuitry 106, including the decoupling capacitors CD1-CD6 and CSW tend to impede fast transitioning between different receive modes of operation. A bias circuit 410 coupled to the input of the LNA 206 facilitates fast transitioning between the different operating modes as further described herein.

Figure 3:
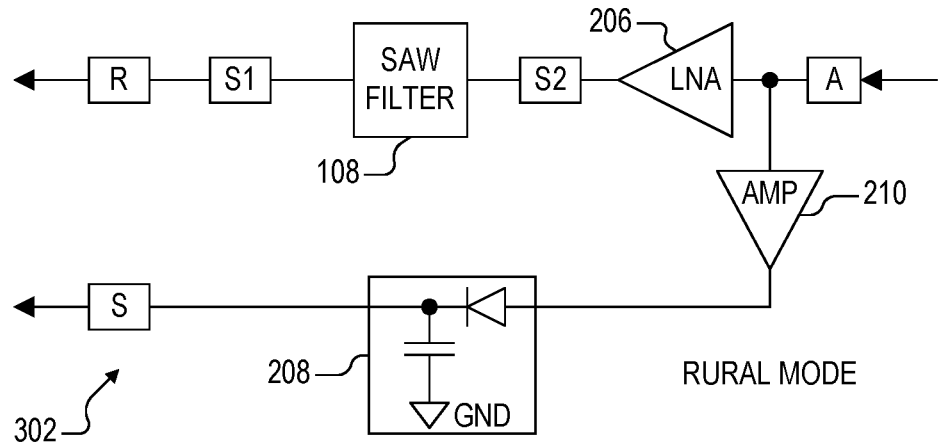
FIG. 3 depicts the front end I/F circuitry of FIG. 1 configured in three different receive modes according to one embodiment of the present disclosure.
Figure 3:
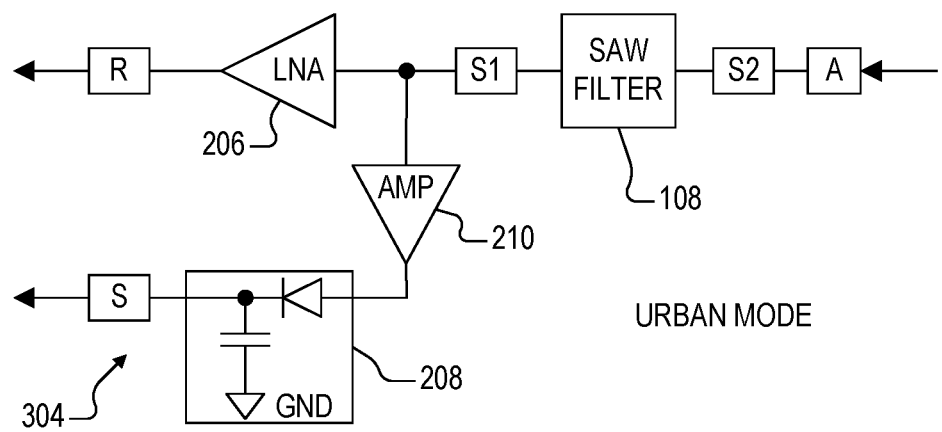
Figure 3:
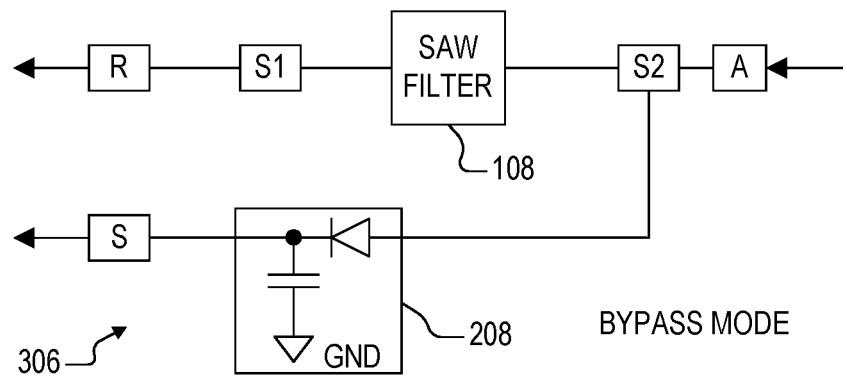

FIG. 3 illustrates 3 simplified block diagrams that depict the front end I/F circuitry 106 configured in three different receive modes according to one embodiment of the present disclosure, including a rural mode 302, an uban mode 304, and a bypass mode 306. The diagram is simplified and the switches 202 and the capacitances CD1-CD6 and CSW are not shown. In each case, the SAW filter 108 is coupled between the S1 and S2 interfaces. In the R mode 302, the input of the LNA 206 is coupled to the antenna input A, the output of the LNA 206 is coupled to the S2 interface, and the S1 interface is coupled to the R output. The input of the amplifier 210 is coupled to the A input, the output of the amplifier 210 is coupled to the input of the peak detector 208, and the output of the peak detector 208 is coupled to the S output. In this manner, the radio 110 senses the relative strength of the received input signal from the antenna 102 via the amplifier 210 and the peak detector 208 for making and updating mode decisions. In the rural mode 302, the received input signal is provided through the LNA 206 and then the SAW filter 108 before being output to the radio 110 via the R output.

In the urban mode 304, the S2 interface is coupled to the A input and the S1 interface is coupled to the inputs of the LNA 206 and the amplifier 210. The output of the LNA 206 is coupled to the R output and the output of the amplifier 210 is coupled to the input of the peak detector 208. The output of the peak detector 208 is coupled to the S output. In this manner, the radio 110 senses the relative strength of the received input signal from the antenna 102 via the SAW filter 108, the amplifier 210, and the peak detector 208 for making mode decisions and updates. In the urban mode 304, the received input signal is provided through the SAW filter 108 and then the LNA 206 before being output to the radio 110. As compared to the rural mode 302, the ordering of the SAW filter 108 and the LNA 206 in the receive path is reversed.

In the bypass mode 306, the LNA 206 is bypassed and is not used. In this case, the S2 interface is coupled to the A input and to the input of the peak detector 208, the S1 interface is coupled to the R output, and the output of the peak detector 208 is coupled to the S output. In one embodiment, the switches 202 or the peak detector 208 may include a multiplexer or the like (not shown) that detects the bypass mode 306 to bypass the amplifier 210. In this manner, the radio 110 senses the relative strength of the received input signal from the antenna 102 via the peak detector 208 for making mode decisions and updates. In the bypass mode 302, the received input signal is provided only through the SAW filter 108 before being output to the radio 110.

During a receive operation, the radio 110 adjusts the MODE signals to place the front end I/F circuitry 106 into one of the receive modes 302, 304, or 306. The rural mode 302 is optimal when there are no blocker signals that may interfere with the signal being received. The SAW filter 108 is lossy and may cause a drop in signal strength. In one embodiment, for example, the SAW filter 108 may cause a 1.5 decibel (dB) to 2.5 dB decrease in signal strength. In the absence of any blocker signals, however, the rural mode allows for an improved noise floor (NF). The urban mode 304 is optimal when an out-of-band blocker signal is present relative to the receive signal meaning that it may not directly interfere with the receive signal but may nonetheless have a negative impact. By placing the SAW filter 108 ahead of the LNA 206, the impact of a blocker may be reduced. The bypass mode 306 is optimal when the receive signal is very strong or when a blocker signal is in-band with respect to the receive signal meaning that it may directly interfere with the receive signal. In either of these cases, the LNA 206 is eliminated.

Although there may not be a default mode such that an initial mode may be selected based on past performance or a particular configuration, assume that the radio 110 initially places the front end I/F circuitry 106 into the rural mode 302. The radio 110 includes an analog front end (not shown) with automatic gain control (AGC) circuitry or the like which may initially be set to high gain to detect a weak signal. The radio 110 monitors its sense input S to detect a receive signal and if so, to determine a relative strength of the receive signal along with any other distinguishing characteristics. When a receive signal is detected, the radio 110 may adjust the AGC gain while processing the receive signal. Such detection and processing may be performed at the front end or preamble of the receive signal. The processing includes a determination of whether a blocker signal is present and the relative strength of the receive signal. If a blocker signal is present, the processing determines the relative frequency between a blocker signal and the frequency of interest of the receive signal. If a blocker signal is not detected, then the radio 110 may keep the front end I/F circuitry 106 in the rural mode 302. If an out-of-band blocker signal is detected, then the radio 110 may switch to the urban mode 304. If the receive signal is very strong or if an in-band blocker signal is detected, then the radio 110 may switch to the bypass mode 306.

The mode switch transitions should be performed relatively quickly such as during the preamble portion of the receive signal so that it may ultimately be successfully received and processed. The switches 202 are used to reconfigure or adjust the front end OF circuitry 106 to optimize a link budget in order to maximize gain and minimize loss while receiving a signal. The reconfiguration or adjustment is determined based on relative strength of the receive signal along with presence, strength and relative frequency location of any blocker signals. The capacitance of the front end I/F circuitry 106, including the decoupling capacitors CD1-CD6 and the capacitance of the switches 202 as depicted by the switch capacitor CSW, tend to impede fast mode switch transitioning. The bias circuit 410 is configured to enable fast operating mode transitioning as further described herein.

Figure 4:
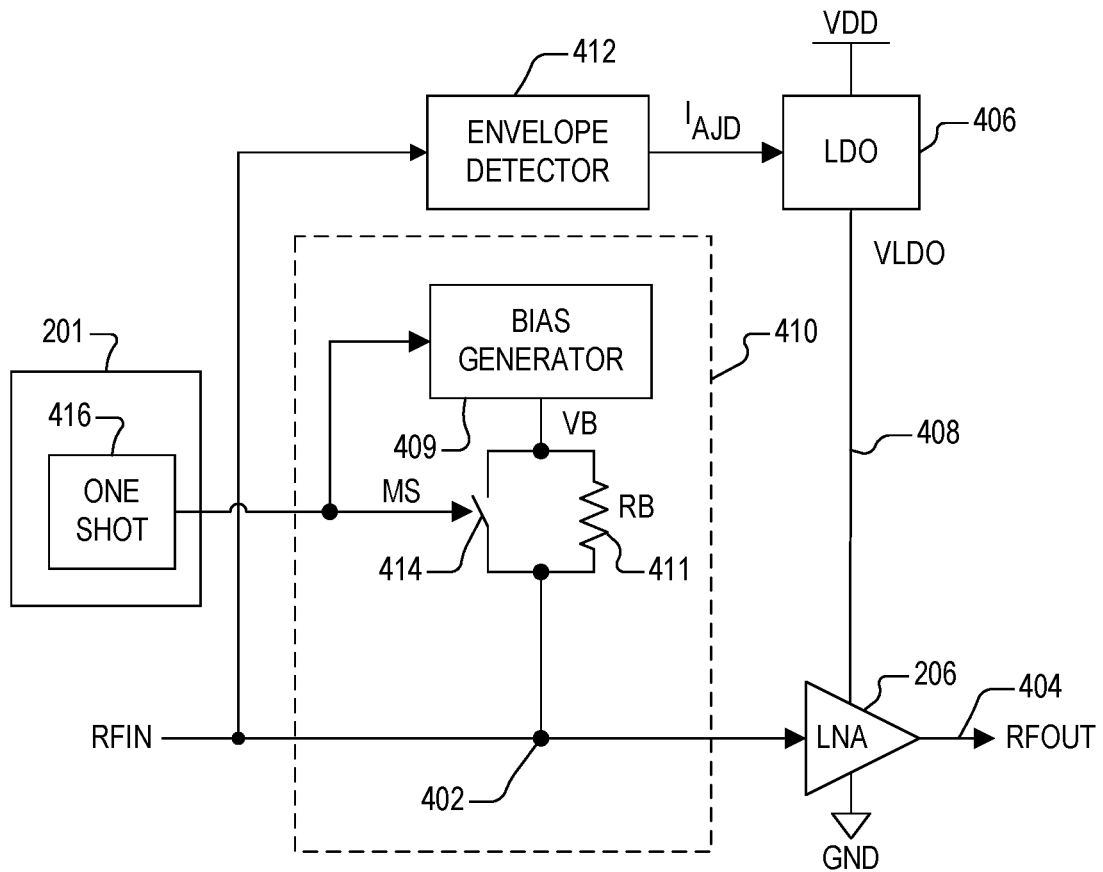
FIG. 4 is a simplified block diagram of the LNA of FIG. 2 and supporting circuitry to facilitate fast mode switching according to one embodiment of the present disclosure.

FIG. 4 is a simplified block diagram of the bias circuit 410 coupled to the LNA 206 along with other supporting circuitry to facilitate fast mode switching according to one embodiment of the present disclosure. The LNA 206 has an input coupled to an input node 402 receiving a radio frequency (RF) input signal RFIN, which may be received from the antenna 102 through the harmonic filter 104 and the large switches 212 in the rural mode 302 or additionally through the SAW filter 108 in the urban mode 304. The LNA 206 has an output coupled to an output node 404 providing an RF output signal RFOUT. A low-dropout (LDO) regulator 406 receives a supply voltage VDD and provides a regulated output voltage VLDO on a supply node 408. The supply node 408 provides VLDO to a voltage supply terminal of the LNA 206, which has a supply reference terminal coupled to a supply reference voltage, such as ground (GND). The VLDO voltage limits the voltage at the output of the LNA 206 to a suitable voltage level. In one embodiment, VDD is about 4 Volts (V) and VLDO has a nominal voltage level of about 2V, although alternative voltage levels are possible and contemplated in different embodiments.

The bias circuit 410 includes a bias generator 409 and a resistor 411 having a resistance RB, in which the bias generator 409 develops and provides a bias voltage VB through the resistor 411 to the RFIN node 402. VB has a voltage level suitable to bias input circuitry of the LNA 206. An envelope detector 412 has an input coupled to RFIN node 402 for detecting a relative power level of the RFIN signal and has an output providing a voltage adjust current $I_{ADJ}$ to an input of the LDO regulator 406. The envelope detector 412 reduces the voltage level of VLDO when the power level of RFIN reaches or exceeds a predetermined power level threshold to protect the devices of the LNA 206 and to limit the power level of RFOUT to a predetermined output power level. In one embodiment, for example, when the power level of RFIN rises above 0 decibel-milliwatts (dBm), the envelope detector 412 adjusts TAW to reduce the voltage level of VLDO to reduce the maximum power level of RFOUT to about 10 dBm.

The bias circuit 410 further includes a normally-open single-pole, single-throw (SPST) switch 414 having its switched terminals coupled in parallel with the resistor 411 and has a control input receiving a mode switch signal MS from the mode control circuitry 201. In one embodiment, the mode control circuitry 201 includes a one-shot device 416 or the like that provides that MS signal and that momentarily pulses the MS signal in response to a mode transition as further described herein. The MS signal is also provided to an input of the bias generator 409. The resistance RB of the resistor 411 is relatively large to minimize noise contribution during normal operation of the LNA 206. During a mode switch from one operating mode to another during a receive operation, however, the relatively large resistance RB of the resistor 411 inhibits current levels to the LNA 206 significantly increasing a time constant during switching which unduly delays mode transitioning time. The current to or from the bias circuit 410 is used to discharge or charge decoupling capacitors (e.g., CD1-CD6) and the switching capacitance of the switches 202 (e.g., CSW and any other stray capacitance) as quickly as possible to effectuate the mode change. In certain cases, such as when switching from any other mode to the rural mode 302 or to the urban mode 304, the one-shot device 416 of the mode control circuitry 201 momentarily pulses the MS signal during mode switching from one operating mode to another. The MS signal momentarily closes the switch 414 to bypass the resistor 411 to allow increased current during mode switching. In addition, the current capacity of the bias generator 409 is momentarily increased during mode switching to enable faster mode switching and transitioning as further described herein.

Figure 5:
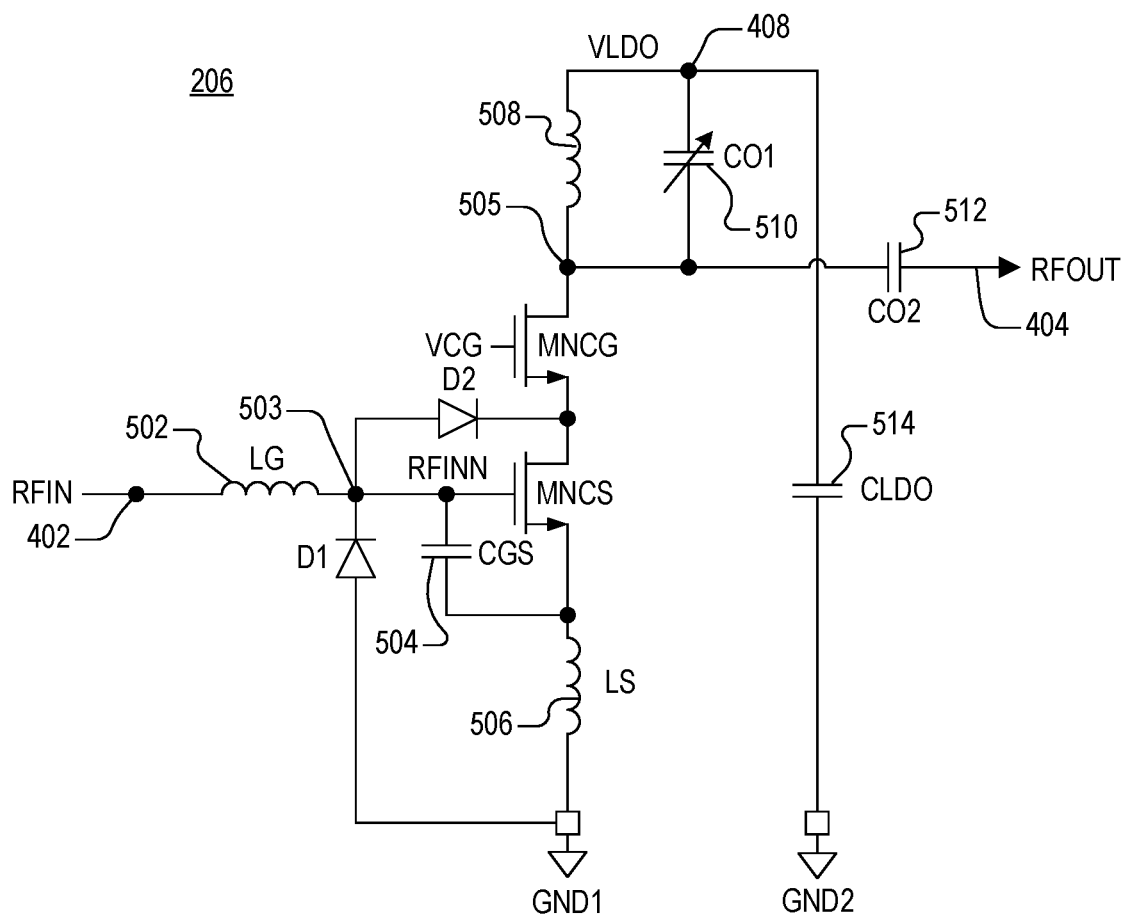
FIG. 5 is a schematic diagram of the LNA of FIG. 2 implemented according to one embodiment of the present disclosure.

FIG. 5 is a schematic diagram of the LNA 206 implemented according to one embodiment of the present disclosure. The RFIN node 402 is coupled to one terminal of an inductor 502 with inductance LG, having its other terminal coupled to a node 503 developing a voltage RFINN. Node 503 is coupled to the cathode of a diode D1, to the anode of a diode D2, to a gate terminal of a transistor MNCS, and to one terminal of a capacitor 504 having a capacitance CGS. The other terminal of capacitor 504 is coupled to a source terminal of MNCS and to one terminal of an inductor 506 having an inductance LS. The anode of D1 and the other terminal of inductor 506 are coupled together at a first ground shown as GND1. The cathode of D2 is coupled to a drain terminal of MNCS and to a source terminal of another transistor MNCG, having a gate terminal receiving a bias voltage VCG. MNCG has a drain terminal coupled to a node 505, which is coupled to one terminal of an inductor 508 having an inductance LD, to one terminal of a capacitor 510 having a capacitance CO1, and to one terminal of another capacitor 512 having a capacitance CO2. The other terminal of capacitor 512 is coupled to RFOUT node 404. The other terminals of inductor 508 and capacitor 510 are coupled to VLDO node 408, which is further coupled to one terminal of a filter capacitor 514 having a capacitance CLDO, which has its other terminal coupled to another ground shown as GND2.

The transistors MNCG and MNCS are shown as N-type MOS (NMOS) transistors having drain and source terminals which may generally be referred to as current terminals and a gate terminal as a control terminal. Other types of transistors are contemplated having current and control terminals in similar manner. The topology of the LNA 206 is a single-ended inductively generated common source amplifier. Input impedance matching is set by inductances LG and LS, capacitance CGS, and a transconductance of MNCS. Output impedance matching is set by inductance LD (or LD-Q) and capacitances CO1 and CO2. A cascode topology is used to improve reverse isolation for better stability by reducing the Miller effect, and by independently tuning input and output networks. Separate ground connections GND1 and GND2 improves reverse isolation although a common ground (e.g., GND) is contemplated. CGS is a combination of MNCS capacitance and Metal-Insulator-Metal (MiM) capacitors (not shown individually). The value of CGS changes with urban/rural operating mode to improve input return loss. The capacitor 510 is shown as a variable capacitor to adjust capacitance CO1 to center the output return loss across process variations. The capacitor 510 may be implemented trimmable MiM capacitors or the like for adjusting CO1.

Figure 6:
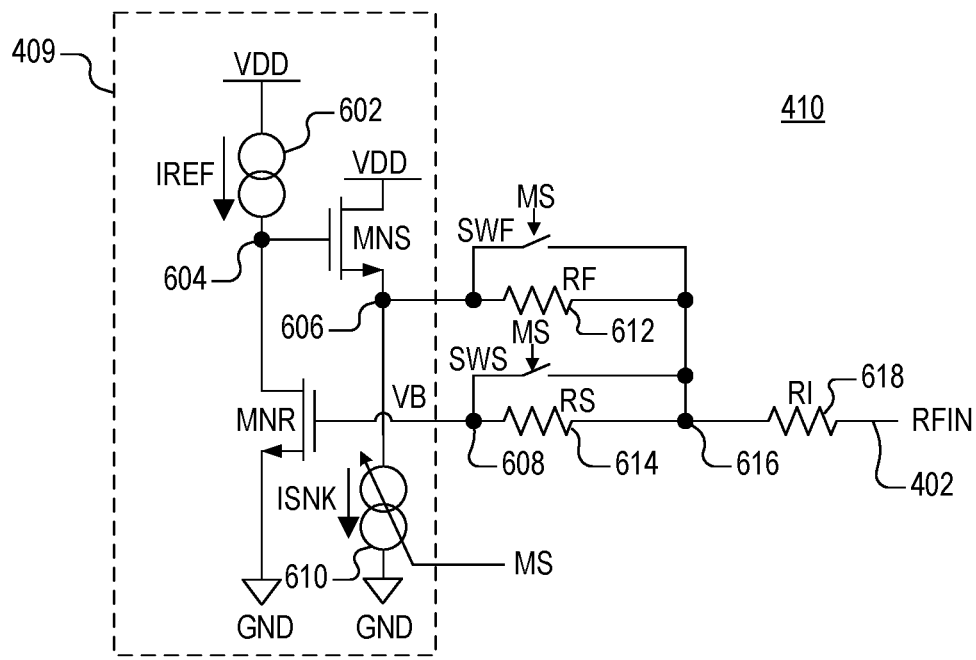
FIG. 6 is a more detailed block diagram schematic diagram of the bias circuitry of FIG. 4 implemented according to one embodiment of the present disclosure.

FIG. 6 is a more detailed schematic diagram of the bias circuit 410 implemented according to one embodiment of the present disclosure. The bias circuit 410 includes the bias generator 409, which further includes a current source 602 coupled and referenced to VDD and providing a reference current IREF to a node 604. An NMOS transistor MNS has a drain terminal coupled to VDD, a gate terminal coupled to node 604, and a source terminal coupled to another node 606. Another NMOS transistor MNR has a drain terminal coupled to node 604, a gate terminal coupled to a bias node 608 developing the VB bias voltage, and a source terminal coupled to GND. An adjustable current sink 610 sinks a current ISNK from node 606 to GND. A resistor 612 having a resistance RF is coupled between node 606 and a preliminary node 616, and another resistor 614 having a resistance RS is coupled between nodes 608 and 616. A first SPST switch SWF is coupled in parallel with the resistor 612 between nodes 606 and 616, and a second SPST switch SWS is coupled in parallel with the resistor 614 between nodes 608 and 616. The switches SWF and SWS may be configured using MOS transistor switching devices. A small isolation resistor 618 having a resistance RI is coupled between the preliminary node 616 and the RFIN node 402.

The resistor 411 is a simplified representation of the resistors 612 and 614, which have relatively large resistances RF and RS, respectively. In one embodiment, the resistances RF and RS are on the order of about 50 Kiloohms (Ku) each. The switch 414 is a simplified representation of the switches SWF and SWS, and each of the switches SWF and SWS has a control input receiving the MS signal. The current sink 610 has an adjust input receiving the MS signal for temporarily increasing the magnitude of ISNK while MS is asserted.

The bias circuit 410 generates a direct-current (DC) bias voltage, via VB, to the gate terminal of the MNCS transistor of the LNA 206 so that MNCS is biased into a desired correct operating region. In one embodiment, for example, MNCS is biased to operate in the saturation region. The voltage of VB is primarily generated at the gate terminal of MNR since the resistance RI of the resistor 618 is small and since there is little current flowing through the resistor 614 during normal operation of the LNA 206. When switching between different operating modes, such as when switching to the rural mode 302 or to the urban mode 304 from any other operating mode (e.g., off, bypass, or any transmitting operating mode), the MS signal is momentarily pulsed high to bypass the large resistances of the resistors 612 and 614 and to momentarily increase the sink current ISNK. ISNK has a default level that it suitable for the LNA 206 during normal operation, and that is increased to a higher level that is suitable to facilitate fast transitioning between operating modes, including when switching into either the rural mode 302 or the urban mode 304. In this manner, the bias circuit 410 is able to source or sink more current faster to and from external capacitances to substantially reduce the time to switch from any other operating mode into the urban or rural modes.

Figure 7:
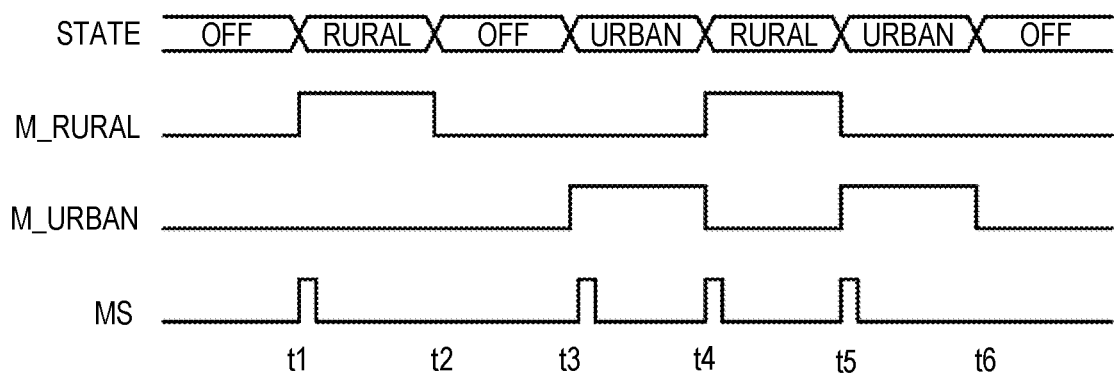
FIG. 7 is a timing diagram plotting a STATE value along with signals M_RURAL, M_URBAN, and MS versus time using the bias circuitry of FIG. 6 according to one embodiment of the present disclosure.

FIG. 7 is a timing diagram plotting a STATE value along with signals M_RURAL, M_URBAN, and MS versus time according to one embodiment of the present disclosure. It is noted that the timing diagram shows an arbitrary switching sequence order illustrating timing of the MS signal in which the switching sequence may be in any order. The STATE value indicates the operating mode of the front end I/F circuitry 106, shown, for example, as OFF, RURAL, URBAN, BYPASS, etc. The M_RURAL signal is asserted during the rural mode 302, the signal M_URBAN is asserted during the urban mode 304, and the MS signal is momentarily pulsed high when switching from any other mode into the rural mode 302 or the urban mode 304. It is noted that there is no need to pulse MS when switching into any other mode including the off or bypass modes. The one-shot device 416 is configured to generate a momentary pulse on MS in response to switching to the urban or rural operating modes.

Prior to a first time t1, STATE indicates that the front end I/F circuitry 106 is initially in the OFF mode, and the signals M_RURAL, M_URBAN, and MS are all low. At time t1, M_RURAL is asserted high to enter the rural mode 302, STATE switches to RURAL, and MS is momentarily pulsed high to facilitate entering the rural mode 302. At subsequent time t2, M_RURAL goes low while M_URBAN stays low and STATE switches to indicate that the front end I/F circuitry 106 enters the off mode. In the illustrated embodiment, MS remains low at time t2 since entering the off mode and not entering either the urban or rural modes. At subsequent time t3, M_URBAN is asserted high to enter the urban mode 304, STATE switches to URBAN, and MS is momentarily pulsed high to facilitate entering the urban mode 304. At subsequent time t4, M_URBAN goes low and M_RURAL is asserted high to enter the rural mode 302, STATE switches to RURAL, and MS is momentarily pulsed high to facilitate entering the rural mode 302. At subsequent time t5, M_RURAL goes low and M_URBAN is asserted high to enter the urban mode 304, STATE switches to URBAN, and MS is momentarily pulsed high to facilitate entering the urban mode 304. At subsequent time t6, M_URBAN goes low while M_RURAL remains low, STATE switches to indicate that the front end I/F circuitry 106 is in the off mode, while MS remains low at time t6 since not entering the urban or rural operating modes. Operation repeats in this manner during subsequent mode switching.

The one-shot device 416 is configured provide a pulse on the MS signal with an optimal duration to effectuate mode transition switching as quickly as possible. Circuit capacitance of the front end I/F circuitry 106 tends to inhibit mode transition in which a charge level one or more of the capacitances is changed from one level to another. In particular, one or more capacitances may be discharged while one or more other capacitances may be charged before a mode change is complete. The bias circuitry 410, which normally serves to provide proper biasing for the LNA 206, is also configured to source and sink current to effectuate mode transition switching. The resistor 411 (FIG. 4) or the resistors 612 and 614 (FIG. 6) have relatively large resistances which otherwise impedes current flow thereby increasing mode transition time. Thus, the switch 414 (FIG. 4) or the switches SWF and SWS (FIG. 6) are momentarily closed by the MS signal to allow a greater current flow to significantly reduce mode transition time. The bias generator 409 is configured as a source follower which is able to source sufficient current (for charging capacitance) but not normally able to sink as much current (for discharging capacitance). Thus, the ISNK current of the current sink 610 is momentarily increased by the MS signal during mode switching. The duration of the MS signal may be empirically determined for a given configuration. In one embodiment, the duration of the MS signal is optimized by being made only sufficiently long to complete or substantially complete the mode change, and then the bias circuit 410 is returned to its normal configuration for normal operation in the new operating mode.

Figure 8:
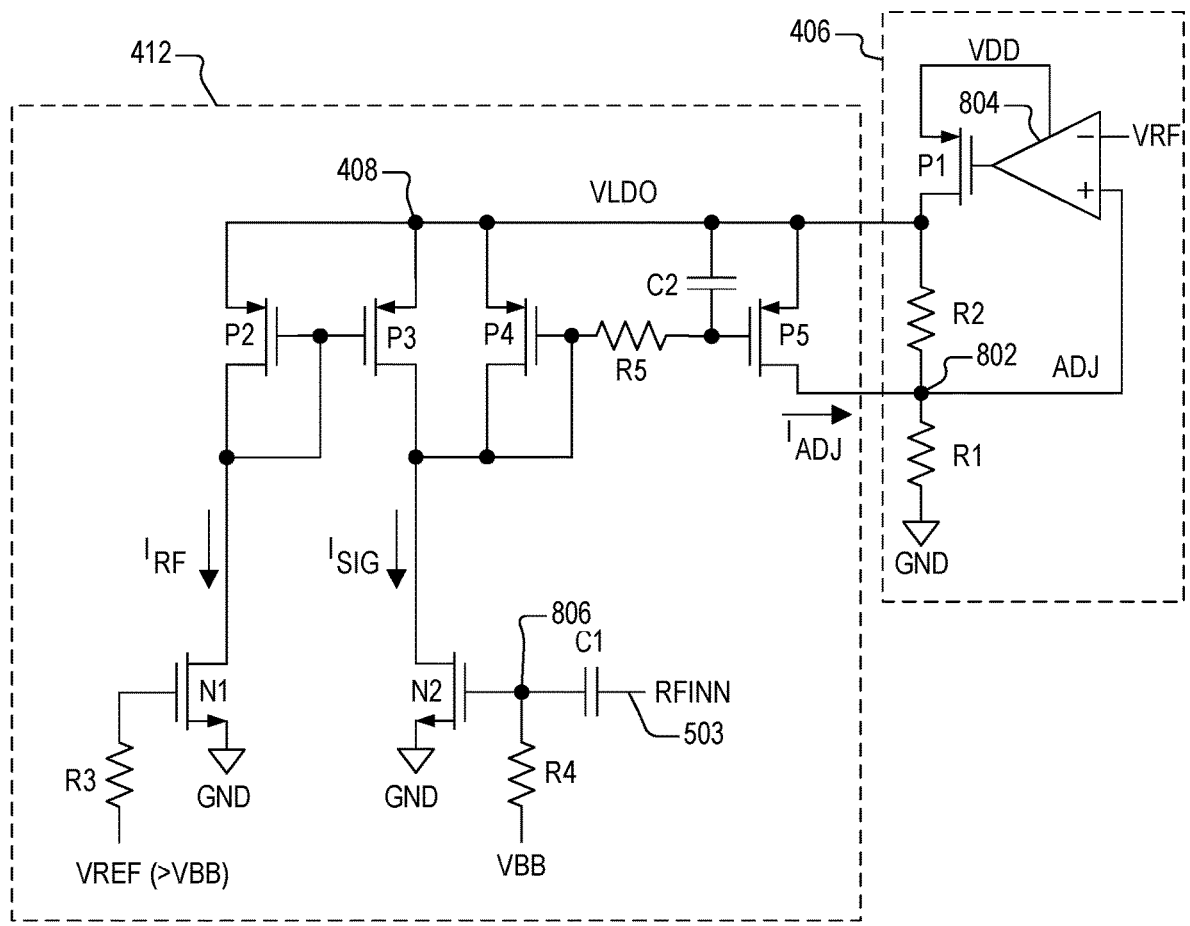
FIG. 8 is a more detailed schematic diagram of the envelope detector and the low-dropout (LDO) regulator of FIG. 4 each implemented according to one embodiment of the present disclosure.

FIG. 8 is a more detailed schematic diagram of the envelope detector 412 and the LDO regulator 406 each implemented according to one embodiment of the present disclosure. The LDO regulator 406 includes a P-type MOS (PMOS) transistor P1 having a source terminal coupled to VDD and a drain terminal coupled to the node 408 that develops the VLDO voltage. A resistor R1 is coupled between GND and a node 802 developing a voltage ADJ and another resistor R2 is coupled between nodes 408 and 802. Node 802 is further coupled to a non-inverting input of an Operational Transconductance Amplifier (OTA) 804, having an inverting input receiving a reference voltage VRF and having an output coupled to a gate terminal of P1. Node 802 receives the voltage adjust current $I_{ADJ}$ from the envelope detector 412 for adjusting the voltage VLDO on node 408 as further described herein.

The envelope detector 412 includes a resistor R3 with one end receiving a reference voltage VREF and another end coupled to a gate terminal of an NMOS transistor N1. N1 has a source terminal coupled to GND and a drain terminal coupled to the drain and gate terminals of a PMOS transistor P2 and to the gate terminal of another PMOS transistor P3. P2 and P3 each have source terminals coupled to the VLDO node 408. P3 has a drain terminal coupled to drain and gate terminals of another PMOS transistor P4 and to the drain terminal of another NMOS transistor N2. N2 has a source terminal coupled to GND and a gate terminal coupled to a node 806. The RFINN node 503 is coupled to one end of a capacitor C1, having another end coupled to node 806. A resistor R4 has one end coupled to node 806 and another end receiving a bias voltage VBB. Generally, C1 is a coupling capacitor while R4 biases the gate of N2. C1 and R collectively form a first-order high-pass filter for RFINN (for removing DC), and a low-pass filter for VBB. P4 has a source terminal coupled to the VLDO node 408 and a gate terminal coupled to one end of a resistor R5. The other end of R5 is coupled to one end of a capacitor C2 and to a gate terminal of another PMOS transistor P5. P5 has a source terminal coupled to the VLDO node 408 and a drain terminal coupled to the ADJ node 802. A reference current $I_{RF}$ flows into the drain terminal of N1, a signal current Ism flows into the drain terminal of N2, and the voltage adjust current $I_{ADJ}$ flows out of the drain terminal of P5 into the ADJ node 802.

As previously described, when the receive signal is very strong or when a blocker signal is in-band with respect to the receive signal meaning that it may directly interfere with the receive signal, then the bypass mode 306 may be selected so that the LNA 206 is bypassed and thus eliminated from the receive signal path. Otherwise, either the rural mode 302 or the urban mode 304 is selected and the LNA 206 is inserted in the receive signal path. In operation of the LDO regulator 406, the OTA 804 drives P1 to maintain a voltage of the ADJ node 802 at about the voltage level of VRF. Assuming the adjust current $I_{ADJ}$ is zero, the resistances of the resistors R1 and R2 are chosen so that the LDO regulator 406 drives the voltage of VLDO to a nominal voltage level NV. Ideally, it is desired to maintain VLDO (and thus NV) as high as possible to optimize linearity of the LNA 206. When a power level of RFIN, and thus RFINN, is below a predetermined power level threshold, the envelope detector 412 drives $I_{ADJ}$ to zero or a negligible level so that VLDO stays at its maximum level NV. When the power level of RFIN and RFINN rises above the predetermined power level threshold, however, the envelope detector 412 operates to increase the current level $I_{ADJ}$ to correspondingly reduce the voltage level of VLDO to protect MNCG and MNCS and to protect input components of any device driven by the LNA 206, such as components within the input portion of the SAW filter 108 when in the rural mode 302. With reference to FIG. 5, for example, when the power level of RFIN and thus RFINN rise above the predetermined power level threshold, the voltage at node 505 may become excessive threatening MNCG and MNCS along with devices coupled to output node 404.

In the illustrated embodiment, the voltage level of VLDO is reduced with an increase of the current $I_{ADJ}$ in accordance with the following equation (1):

$$VLDO=NV-R2*I_{DJ} \quad (1)$$

where R2 is a resistance of the resistor R2 and an asterisk "*" denotes multiplication. Since the voltage level of ADJ is substantially fixed, any positive level of $I_{ADJ}$ flows through R2 to decrease VLDO by a corresponding amount. In one embodiment, VRF is about 1.2V and NV is about 2V. The transistors MNCG and MNCS of the LNA 206 are relatively small devices, such as about 1.5V each, so that VLDO is selected to have a maximum voltage level of about 2V.

In the illustrated embodiment, the envelope detector 412 is a square-law based detector that operates similar to a comparator to compare the currents $I_{SIG}$ and $I_{RF}$ for determining the current level of $I_{ADJ}$ and thus the adjustment of the voltage VLDO. The power level of RFINN is proportional the square of its amplitude, or $A(t)^2$, and the current mirror reference branch including VREF, R3, N1 and P2 establish the predetermined power level threshold used for comparison. VREF is a substantially fixed voltage so that $I_{RF}$ is a substantially fixed current. VBB is also a substantially fixed voltage having a voltage level that is less than VREF, so that the level of Ism generally remains below the level of $I_{RF}$. When the power level of RFIN and thus RFINN is below the predetermined power level threshold, the current mirror configuration of the transistors N1, P2, P3 and N2 keep $I_{SIG}$ less that $I_{RF}$ so that P4 remains off and $I_{ADJ}$ remains zero. When the power level of RFIN and thus RFINN increases above the predetermined power level threshold, $I_{SIG}$ increases and approaches or attempts to exceed $I_{RF}$ turning P4 on. P4 and P5 are configured in a current mirror configuration so that P5 also turns on and begins to drive $I_{ADJ}$ above zero. R5 and C2 collectively form a low-pass filter that filters RF frequencies and instead drives the current $I_{ADJ}$ at a level proportional to a relative power level of RFIN that exceeds the predetermined power level threshold. Essentially, the current level of $I_{ADJ}$ has a magnitude that is proportional to a relative power level of RFINN (and thus RFIN) that is above the predetermined power level threshold, which reduces the voltage level of VLDO by a corresponding amount to protect devices of the LNA 206 and any devices driven by the LNA 206.

In the illustrated embodiment, $I_{RF}=\beta_1(VREF-V_{TH1})^2$ in which $\beta_1$ is a gain factor and $V_{TH1}$ is a threshold voltage both associated with N1. Also, $I_{SIG}=\beta_2(VBB+RFINN-V_{TH2})^2$ or $I_{SIG}=\beta_2(VBB-V_{TH2})^2+\beta_2(RFINN)^2+2\beta_2(VBB-V_{TH2})$ *RFINN in which $\beta_2$ is a gain factor and $V_{TH2}$ is a threshold voltage both associated with N2. In addition, RFINN=A(t) *cos($\omega$t+$\phi$(t)) which is an amplitude and phase modulated signal. Substituting, $I_{SIG}$ may be written according to the following equation (2):

$$I_{SIG}=\beta_2(VBB-V_{TH2})^2+\tfrac{1}{2}\beta_2 A(t)^2+\tfrac{1}{2}\beta_2*\cos(2\omega t+2\phi(t))+2\beta_2(VBB-V_{TH2})*A(t)*\cos(\omega t+\phi(t)) \quad (2)$$

in which the second portion of equation (2) shown in italics is the RF portion that is filtered out by the low-pass filter formed by R5 and C2.

The envelope detector 412 is configured such that when the squared magnitude $A(t)^2$ of RFINN (corresponding to the magnitude of RFIN) is below the predetermined power level threshold, then $I_{RF}$ is greater than $I_{SIG}$ so that $I_{ADJ}$ is zero. When, however, the power level of RFINN rises above the predetermined power level threshold, then the envelope detector 412 operates to generate $I_{ADJ}$ according to the following equation (3):

$$I_{ADJ}=\beta_2(VBB-V_{TH2})^2+\tfrac{1}{2}\beta_2*A(t)-\beta_1(VREF-V_{TH1})^2 \quad (3)$$

As the power level of RFIN and thus RFINN rises above the predetermined power level threshold, $I_{SIG}$ rises (or attempts to rise) above $I_{RF}$ and $I_{ADJ}$ increases above zero in accordance with equation (3). As $I_{ADJ}$ increases above zero, VLDO decreases from NV in accordance with equation (1). In one embodiment, VLDO decreases from about 2V to about 1.5V as the magnitude of RFIN rises above the predetermined power level threshold. In one embodiment, for example, when the power level of RFIN rises above 0 dBm, the envelope detector 412 adjusts $I_{ADJ}$ to reduce the voltage level of VLDO to reduce the maximum power level of RFOUT to about 10 dBm.

Alterative detection circuitry configurations of the envelope detector 412 and the LDO 406 are contemplated. In one embodiment, a peak detector or the like may be used with proper filtering, particularly for configurations in which RFIN has a fixed amplitude. In another embodiment, a power detection circuitry or the like may be used. The LDO 406 may be replaced by alternative adjustable voltage regulators.

The present description has been presented to enable one of ordinary skill in the art to make and use the present invention as provided within the context of particular applications and corresponding requirements. The present invention is not intended, however, to be limited to the particular embodiments shown and described herein, but is to be accorded the widest scope consistent with the principles and novel features herein disclosed. Many other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention.

The invention claimed is:

1. A bias circuit for a low noise amplifier of a front end interface of a radio frequency communication device, the bias circuit comprising:
 a bias generator that provides a bias voltage on a bias node for the low noise amplifier, wherein a current capacity of the bias generator is at a default level for each of a plurality of modes;
 a first resistive device coupled between the bias node and an input of the low noise amplifier;
 a first switch coupled in parallel with the first resistive device; and
 mode control circuitry receiving at least one mode signal indicative of a mode change from a first one of the plurality of modes to a second one of the plurality of modes, wherein the mode control circuitry, in response to a mode change, momentarily activates the first switch to bypass the first resistive device and momentarily increases current capacity of the bias generator from the default level by momentarily increasing its capacity to sink current before returning the current capacity back to the default level for the second one of the plurality of modes.

2. The bias circuit of claim 1, wherein the first switch is activated during a pulse of a mode switch signal having a duration sufficient to change from a first mode to a second mode.

3. The bias circuit of claim 1, wherein the bias generator further comprises:
 a current source that provides a reference current to a first node;
 a reference transistor having current terminals coupled between the first node and a supply reference node and having a control terminal coupled to the bias node;
 a bias transistor having current terminals coupled between a source voltage node and an intermediate node and having a control terminal coupled to the first node; and
 a current sink coupled between the intermediate node and the supply reference node;
 wherein the mode control circuitry, in response to the mode change, momentarily increases current capacity of the current sink in response to the mode change.

4. The bias circuit of claim 3, further comprising:
 a second resistive device coupled between the intermediate node and the input of the low noise amplifier; and
 a second switch coupled in parallel with the second resistive device;
 wherein the mode control circuitry, in response to the mode change, momentarily activates the second switch to bypass the second resistive device.

5. The bias circuit of claim 4, wherein the mode control circuitry provides a mode switch signal to a control input of the first and second switches and to an adjust input of the current sink.

6. The bias circuit of claim 5, wherein the mode control circuitry comprises a one-shot device that asserts a pulse on the mode switch signal in response to the mode change.

7. The bias circuit of claim 5, wherein the mode control circuitry asserts a pulse on the mode switch signal in which the pulse has a duration sufficient for the bias circuit to adjust charge on external capacitance.

8. The bias circuit of claim 1, wherein the at least one mode signal indicates a plurality of modes including a first mode in which the low noise amplifier is placed before a filter in a receive path of a radio communication device, and including a second mode in which the low noise amplifier is placed in front of the filter in the receive path.

9. The bias circuit of claim 1, further comprising an output resistive device coupled between the first resistive device and the input of the low noise amplifier.

10. A front end interface for a radio frequency communication device, comprising:
 a plurality of functional blocks including a low noise amplifier, a peak detector, and a saw filter;
 a plurality of switches controlled by mode control circuitry for selectively coupling selected ones of the plurality of functional blocks and a plurality of input/output interfaces coupled with decoupling capacitors; and
 a bias circuit, comprising:
  a bias generator that provides a bias voltage on a bias node for the low noise amplifier;
  a first resistive device coupled between the bias node and an input of the low noise amplifier; and
  a first switch coupled in parallel with the first resistive device;
 wherein the mode control circuitry receives at least one mode signal indicative of a mode change and momentarily activates the first switch to bypass the first resistive device and momentarily increases current capacity of the bias generator.

11. The front end interface of claim 10, wherein the bias generator further comprises:
 a current source that provides a reference current to a first node;
 a reference transistor having current terminals coupled between the first node and a supply reference node and having a control terminal coupled to the bias node;
 a bias transistor having current terminals coupled between a source voltage node and an intermediate node and having a control terminal coupled to the first node; and a current sink coupled between the intermediate node and the supply reference node;

wherein the mode control circuitry, in response to the mode change, momentarily increases current capacity of the current sink in response to the mode change.

12. The front end interface of claim 11, further comprising:

a second resistive device coupled between the intermediate node and the input of the low noise amplifier; and a first switch coupled in parallel with the second resistive device;

wherein the mode control circuitry, in response to the mode change, momentarily activates the second switch to bypass the second resistive device.

13. The front end interface of claim 12, wherein the mode control circuitry provides a mode switch signal to a control input of the first and second switches and to an adjust input of the current sink.

14. The front end interface of claim 13, wherein the mode control circuitry comprises a one-shot device that asserts a pulse on the mode switch signal in response to the mode change.

15. The front end interface of claim 13, wherein the mode control circuitry asserts a pulse on the mode switch signal in which the pulse has a duration sufficient for the bias circuit to adjust charge on external capacitance comprising the plurality of switches and the decoupling capacitors.

16. The front end interface of claim 10, wherein the at least one mode signal indicates a plurality of modes including a first mode in which the low noise amplifier is placed before the saw filter in a receive path of the radio communication device, and including a second mode in which the low noise amplifier is placed in front of the saw filter in the receive path.

17. A method of enabling fast transitions of a front end interface of a radio frequency communication device between a plurality of different operating modes, the method comprising:

biasing an input of a low noise amplifier of the front end interface with a bias circuit, the bias circuit comprising a bias generator that has a current capacity at a default level for each of a plurality of modes and that provides a bias voltage to an input of the low noise amplifier via at least one noise reduction resistive device;

receiving a mode change indication indicating a change from a first one of the plurality of modes to a second one of the plurality of modes;

in response to receiving the mode change indication, momentarily shorting the at least one noise reduction resistive device; and in response to receiving the mode change indication, momentarily increasing a current capacity of the bias generator from the default level by momentarily increasing its capacity to sink current before returning the current capacity back to the default level for the second one of the plurality of modes.

18. The method of claim 17, wherein the bias circuit comprises first and second noise reduction devices, further comprising, in response to receiving the mode change indication, momentarily shorting the first and second noise reduction resistive devices.

19. The method of claim 17, wherein the bias generator comprises a current sink having an input coupled to the input of the low noise amplifier, further comprising, in response to receiving the mode change indication, momentarily increasing the current capacity of the current sink.

* * * * *